United States Patent
Cho et al.

(10) Patent No.: US 9,384,796 B2
(45) Date of Patent: Jul. 5, 2016

(54) SEMICONDUCTOR MEMORY DEVICE AND MEMORY SYSTEM INCLUDING THE SAME

(71) Applicant: SAMSUNG ELECTRONICS CO., LTD., Suwon-Si, Gyeonggi-Do (KR)

(72) Inventors: Yong-Ki Cho, Hwaseong-Si (KR); Du-Yeul Kim, Hwaseong-Si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/726,652

(22) Filed: Jun. 1, 2015

(65) Prior Publication Data

US 2016/0042773 A1 Feb. 11, 2016

(30) Foreign Application Priority Data

Aug. 5, 2014 (KR) .......... 10-2014-0100279

(51) Int. Cl.
*G11C 7/22* (2006.01)
*G11C 7/10* (2006.01)

(52) U.S. Cl.
CPC .......... *G11C 7/1063* (2013.01); *G11C 7/22* (2013.01)

(58) Field of Classification Search
None
See application file for complete search history.

(56) References Cited

U.S. PATENT DOCUMENTS

| 7,528,752 B1* | 5/2009 | Chern | H03M 1/1019 341/118 |
|---|---|---|---|
| 2004/0145963 A1* | 7/2004 | Byon | G11C 7/22 365/149 |
| 2007/0070741 A1 | 3/2007 | Kim et al. | |

FOREIGN PATENT DOCUMENTS

KR 0838389 B 6/2008

* cited by examiner

*Primary Examiner* — James G Norman
(74) *Attorney, Agent, or Firm* — Volentine & Whitt, PLLC

(57) ABSTRACT

A semiconductor memory device includes a core region for storing data and a peripheral region for controlling the core region. The semiconductor memory device includes a digital noise measurement circuit and an output selection circuit. The digital noise measurement circuit selects a first operation voltage among a plurality of operation voltages based on a voltage selection signal, generates first noise data by digitizing first noise in the first operation voltage based on a plurality of reference voltages, and outputs the first noise data. The plurality of operation voltages are supplied to the core region and the peripheral region. The output selection circuit outputs one of first data and the first noise data based on an output selection signal. The first data is provided from the core region.

20 Claims, 12 Drawing Sheets

SEMICONDUCTOR MEMORY DEVICE AND MEMORY SYSTEM INCLUDING THE SAME

CROSS-REFERENCE TO RELATED APPLICATION

This application claims priority under 35 USC §119 to Korean Patent Application No. 10-2014-0100279, filed on Aug. 5, 2014 in the Korean Intellectual Property Office (KIPO), the contents of which are herein incorporated by reference in their entirety.

BACKGROUND

1. Technical Field

Example embodiments relate generally to semiconductor devices, and more particularly to semiconductor memory devices and memory systems including the semiconductor memory devices.

2. Description of the Related Art

Semiconductor memory devices can be generally divided into two categories depending upon whether they retain stored data when disconnected from power. These categories include volatile memory devices, which lose stored data when disconnected from power, and nonvolatile memory devices, which retain stored data when disconnected from power. The semiconductor memory device may include core regions and peripheral regions. The core regions include a plurality of memory cells that store data, and the peripheral regions include a plurality of circuits for controlling the core regions. A plurality of operation voltages may be provided to the core regions and the peripheral regions. Noises may occur in the plurality of operation voltages based on various factors.

SUMMARY

Accordingly, the present disclosure is provided to address one or more problems due to limitations and disadvantages of the related art.

At least one example embodiment of the present disclosure provides a semiconductor memory device capable of detecting noises in operation voltages and outputting the detected noise values.

At least one example embodiment of the present disclosure provides a memory system including the semiconductor memory device.

According to example embodiments, a semiconductor memory device includes a core region configured to store data and a peripheral region configured to control the core region. The semiconductor memory device includes a digital noise measurement circuit and an output selection circuit. The digital noise measurement circuit is configured to select a first operation voltage among a plurality of operation voltages based on a voltage selection signal, generate first noise data by digitizing first noise in the first operation voltage based on a plurality of reference voltages, and output the first noise data. The plurality of operation voltages are supplied to the core region and the peripheral region. The output selection circuit is configured to output one of first data and the first noise data based on an output selection signal. The first data is provided from the core region.

In an example embodiment, the output selection circuit may output the first data based on a read command when a first operation mode is enabled based on the output selection signal. The output selection circuit may output the first noise data based on the read command when a second operation mode is enabled based on the output selection signal.

The first operation mode may be a normal or regular output mode. The second operation mode may be a multi-purpose register (MPR) output mode. The output selection signal may be an MPR enable signal.

In an example embodiment, the digital noise measurement circuit may include a voltage selection unit and a noise detection unit. The voltage selection unit may select the first operation voltage among the plurality of operation voltages based on the voltage selection signal. The noise detection unit may generate portions or bits of the first noise data by comparing the first operation voltage with the plurality of reference voltages.

The noise detection unit may generate a first bit among the bits of the first noise data by comparing the first operation voltage with a first reference voltage among the plurality of reference voltages. The noise detection unit may generate an n-th bit among the bits of the first noise data by comparing the first operation voltage with an n-th reference voltage among the plurality of reference voltages, where n is a natural number equal to or greater than two.

The first bit may correspond to a least significant bit (LSB) of the first noise data, and the n-th bit may correspond to a most significant bit (MSB) of the first noise data.

In an example embodiment, the digital noise measurement circuit may further include a noise storage unit. The noise storage unit may store and may output the bits of the first noise data.

In an example embodiment, the noise storage unit may include a plurality of registers. Each of the plurality of registers may store a respective one of the bits of the first noise data. A first register among the plurality of registers may include a first n-type metal oxide semiconductor (NMOS) transistor, a second NMOS transistor, a first inverter, a second inverter, a third inverter and a fourth inverter. The first NMOS transistor may be connected between a first node and a first bit among the bits of the first noise data. The first NMOS transistor may have a gate electrode connected to a second node. The second NMOS transistor may be connected between the first node and a ground voltage. The second NMOS transistor may have a gate electrode receiving a reset signal. The first inverter may have an input terminal connected to the first node and an output terminal connected to the second node. The second inverter may have an input terminal connected to the second node and an output terminal connected to the first node. The third inverter may have an input terminal connected to the second node and an output terminal connected to a third node. The fourth inverter may have an input terminal connected to the third node and an output terminal connected to the second node.

In an example embodiment, the noise storage unit may include a plurality of registers. Each of the plurality of registers may store a respective one of the bits of the first noise data. A first register among the plurality of registers may include a first p-type metal oxide semiconductor (PMOS) transistor, a second PMOS transistor, a first inverter, a second inverter, a third inverter and a fourth inverter. The first PMOS transistor may be connected between a first node and a first bit among the bits of the first noise data. The first PMOS transistor may have a gate electrode connected to a second node. The second PMOS transistor may be connected between the first node and a ground voltage. The second PMOS transistor may have a gate electrode receiving a reset signal. The first inverter may have an input terminal connected to the first node and an output terminal connected to the second node. The second inverter may have an input terminal connected to the second node and an output terminal connected to the first node. The third inverter may have an input terminal connected to the second node and an output terminal connected to a third node. The fourth inverter may have an input terminal connected to the third node and an output terminal connected to the second node.

In an example embodiment, the digital noise measurement circuit may include a voltage selection unit and an analog-to-digital conversion (ADC) unit. The voltage selection unit may select the first operation voltage among the plurality of operation voltages based on the voltage selection signal. The ADC unit may generate bits of the first noise data based on the first operation voltage and the plurality of reference voltages.

In an example embodiment, the semiconductor memory device may further include a trim circuit. The trim circuit may adjust the first operation voltage based on the first noise data to enhance or regulate an operation of the semiconductor memory device. The trim circuit may increase a deadzone associated with the first operation voltage when the first noise data is smaller than reference noise data. The trim circuit may decrease the deadzone associated with the first operation voltage when the first noise data is equal to or greater than the reference noise data.

In an example embodiment, the semiconductor memory device may further include an output driver and a data input/output (I/O) pad. The output driver may be connected to the output selection circuit. The data I/O pad may be connected to the output driver.

The plurality of operation voltages may include a plate voltage, a bitline precharge voltage, a ground voltage, a boosting voltage and a cell array operating voltage.

The first noise may include at least one of positive peak noise and negative peak noise.

According to example embodiments, a memory system may include a memory controller and a semiconductor memory device. The semiconductor memory device is controlled by the memory controller and includes a core region for storing data and a peripheral region for controlling the core region. The semiconductor memory device includes a digital noise measurement circuit and an output selection circuit. The digital noise measurement circuit is configured to select a first operation voltage among a plurality of operation voltages based on a voltage selection signal, generate first noise data by digitizing first noise in the first operation voltage based on a plurality of reference voltages, and output the first noise data. The plurality of operation voltages are supplied to the core region and the peripheral region. The output selection circuit outputs one of first data and the first noise data based on an output selection signal. The first data is provided from the core region.

The semiconductor memory device according to example embodiments may generate, in the semiconductor memory device, the noise data by digitizing the noise in the operation voltages, and thus the noise in the operation voltages may be efficiently detected without loss and/or attenuation. In addition, the semiconductor memory device may selectively output the noise data via the data I/O pad and the noise output path that is selectively enabled based on the output selection signal, and thus the digital noise data may be efficiently output.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
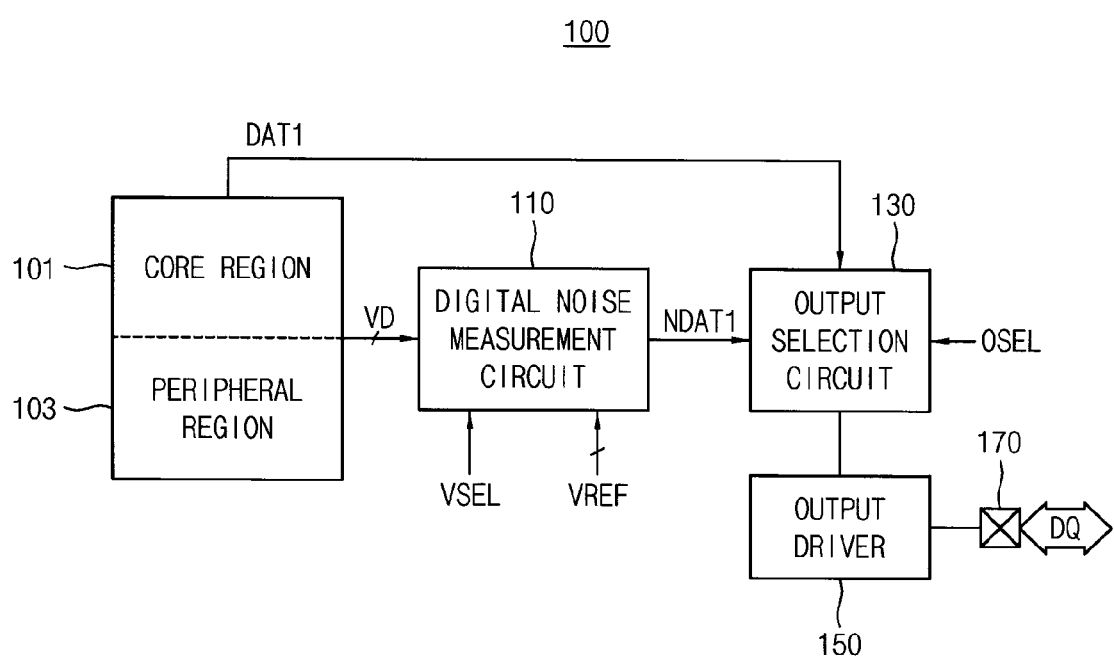
FIG. 1 is a block diagram illustrating a semiconductor memory device according to example embodiments.

Various example embodiments will be described more fully with reference to the accompanying drawings, in which embodiments are shown. The present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device according to example embodiments. Referring to FIG. 1, a semiconductor memory device 100 includes a core region 101 for storing data and a peripheral region 103 for controlling the core region 101. The semiconductor memory device 100 includes a digital noise measurement circuit 110 and an output selection circuit 130. The semiconductor memory device 100 may further include an output driver 150 and a data input/output (I/O) pad 170.

The core region 101 may include a plurality of memory cells (not illustrated) that store the data. The core region 101 may be referred to as a memory region. The peripheral region 103 may include a plurality of circuits that control operations of the core region 101 (e.g., a write operation for storing data into the core region 101 and/or a read operation for retrieving data from the core region 101). Detailed configurations and operations of the core region 101 and the peripheral region 103 will be described below with reference to FIG. 2.

The digital noise measurement circuit 110 selects a first operation voltage (e.g., VD1 in FIG. 3), which is desired to detect noise, among a plurality of operation voltages VD based on a voltage selection signal VSEL. The plurality of operation voltages VD are supplied to the core region 101 and the peripheral region 103. The core region 101 and the peripheral region 103 may operate based on at least one of the operation voltages VD. For example, the plurality of operation voltages VD may include a plate voltage VP, a bitline precharge voltage VBL, a ground voltage VSS, a boosting voltage VPP, a cell array operating voltage VINTA, etc. The digital noise measurement circuit 110 generates first noise data NDAT1 by digitizing first noise in the first operation voltage VD1 based on a plurality of reference voltages VREF and outputs the first noise data NDAT1.

The output selection circuit 130 outputs one of first data DAT1 and the first noise data NDAT1 based on an output selection signal OSEL. The first data DAT1 is provided from the core region 101. The first data DAT1 may be normal data stored in the core region 101 (e.g., in the plurality of memory cells). The first noise data NDAT1 may correspond to the first noise in the first operation voltage VD1.

The output selection circuit 130 may output the first data DAT1 based on a read command when a first operation mode is enabled based on the output selection signal OSEL and may output the first noise data NDAT1 based on the read command when a second operation mode is enabled based on the output selection signal OSEL. In other words, the output selection circuit 130 may enable a normal output path connected to the core region 101 in the first operation mode and may enable a noise output path connected to the digital noise measurement circuit 110 in the second operation mode.

In some example embodiments, the first operation mode may be a normal output mode, and the second operation mode may be a noise output mode. In this case, the output selection circuit 130 may include a switch that selectively enables one of the normal output path and the noise output path based on the output selection signal OSEL.

In other example embodiments, the first operation mode may be the normal or regular output mode, and the second operation mode may be a multi-purpose register (MPR) output mode. In this case, the output selection circuit 130 may include at least one MPR that is included in a dual data rate 4 (DDR4) synchronous dynamic random access memory (SDRAM), without an additional switch for selectively enabling one of the normal output path and the noise output path. In addition, when the second operation mode is the MPR output mode, the output selection signal OSEL may be a MPR enable signal.

In some example embodiments, each of the digital noise measurement circuit 110 and the output selection circuit 130 may be disposed in one of the core region 101 and the peripheral region 103.

The output driver 150 may be connected to the output selection circuit 130. The data I/O pad 170 may be connected to the output driver 150. One of the first data DAT1 and the first noise data NDAT1 may be output from the semiconductor memory device 100 via the output driver 150 and the data I/O pad 170. One of the first data DAT1 and the first noise data NDAT1 may be provided as output data DQ to an external device (e.g., a memory controller, a host and/or a test device).

Although FIG. 1 illustrates the example where the semiconductor memory device 100 includes a single output driver 150 and a single data I/O pad 170, the semiconductor memory device according to example embodiments may include a plurality of output drivers and a plurality of data I/O pads.

Although not illustrated in FIG. 1, the digital noise measurement circuit 110 may select another one of the plurality of operation voltages VD other than the first operation voltage VD1. The digital noise measurement circuit 110 may generate another noise data by digitizing noise in the selected another operation voltage and may output the other noise data.

The other noise data generated by the digital noise measurement circuit 110 may selectively output from the semiconductor memory device 100 via the output selection circuit 130, the output driver 150 and the data I/O pad 170.

The semiconductor memory device 100 according to example embodiments may generate, in the semiconductor memory device 100, the noise data NDAT1 by digitizing the noise in the operation voltages VD, and thus the noise in the operation voltages VD may be efficiently detected without loss and/or attenuation. In addition, the semiconductor memory device 100 may selectively enable the noise output path based on the output selection signal OSEL and may selectively output the noise data NDAT1 via the noise output path and the data I/O pad 170, and thus the digital noise data NDAT1 may be efficiently output.

Figure 2:
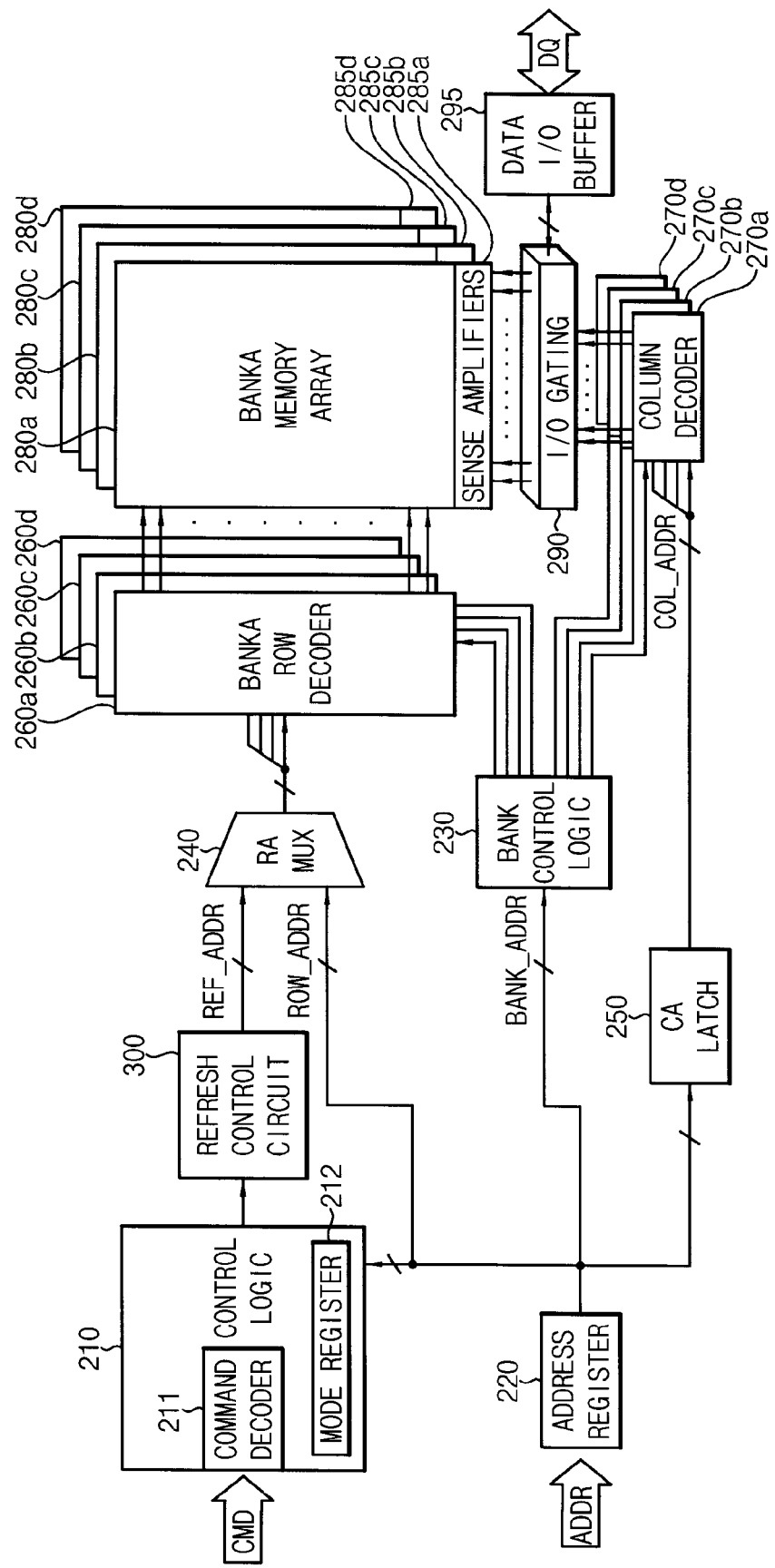
FIG. 2 is a block diagram illustrating various components included in a core region and a peripheral region of the semiconductor memory device of FIG. 1.

FIG. 2 is a block diagram illustrating various components included in a core region and a peripheral region of the semiconductor memory device of FIG. 1. Referring to FIG. 2, a semiconductor memory device may include a control logic 210, an address register 220, a bank control logic 230, a row address multiplexer 240, a column address latch 250, a row decoder 260, a column decoder 270, a memory cell array 280, a sense amplifier unit 285, an I/O gating circuit 290, a data I/O buffer 295 and a refresh control circuit 300.

In some example embodiments, the semiconductor memory device of FIG. 2 may be implemented with a dynamic random access memory (DRAM) device. The digital noise measurement circuit 110, the output selection circuit 130 and the data I/O pad 170 in the semiconductor memory device 100 of FIG. 1 are omitted in FIG. 2 for convenience of illustration.

The memory cell array 280 may include a plurality of bank arrays, e.g., first through fourth bank arrays 280a, 280b, 280c and 280d. The row decoder 260 may include a plurality of bank row decoders, e.g., first through fourth bank row decoders 260a, 260b, 260c and 260d connected to the first through fourth bank arrays 280a, 280b, 280c and 280d, respectively. The column decoder 270 may include a plurality of bank column decoders, e.g., first through fourth bank column decoders 270a, 270b, 270c and 270d connected to the first through fourth bank arrays 280a, 280b, 280c and 280d, respectively. The sense amplifier unit 285 may include a plurality of bank sense amplifiers, e.g., first through fourth bank sense amplifiers 285a, 285b, 285c and 285d connected to the first through fourth bank arrays 280a, 280b, 280c and 280d, respectively. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although FIG. 2 illustrates the example where the semiconductor memory device includes four banks, in other example embodiments, the semiconductor memory device may include any number of banks.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh address REF_ADDR from the refresh control circuit 300. The row address multiplexer 240 may selectively output the row address ROW_ADDR or the refresh address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the I/O gating circuit 290 to output data corresponding to the column address COL_ADDR.

The I/O gating circuit 290 may include a circuitry for gating I/O data. The I/O gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data I/O buffer 295. Data DQ to be written to one bank array of the first through fourth bank arrays 280a, 280b, 280c and 280d may be provided from the memory controller to the data I/O buffer 295. The data DQ provided to the data I/O buffer 295 may be written to the one bank array via the write drivers. For example, the data I/O buffer 295 may include the output driver 150 in FIG. 1 and may be connected to the data I/O pad 170 in FIG. 1.

The control logic 210 may control an operation of the semiconductor memory device. For example, the control logic 210 may generate control signals for the semiconductor memory device to perform a write operation or a read operation. The control logic 210 may include a command decoder 211 that decodes a command CMD received from the memory controller and a mode register 212 that sets an operation mode of the semiconductor memory device. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The command decoder 211 may further receive a clock signal (e.g., CLK) and a clock enable signal (e.g., /CKE) for operating the semiconductor memory device in a synchronous scheme.

In some example embodiments, the memory cell array and the sense amplifier unit in FIG. 2 may be disposed in a core region (e.g., the core region 101 in FIG. 1). Other components in FIG. 2, e.g., the control logic 210, the address register 220, the bank control logic 230, the row address multiplexer 240, the column address latch 250, the row decoder 260, the column decoder 270, the I/O gating circuit 290, the data I/O buffer 295 and the refresh control circuit 300, may be disposed in a peripheral region (e.g., the peripheral region 103 in FIG. 1).

Although FIG. 2 illustrates the example where the semiconductor memory device is implemented with a DRAM device, the semiconductor memory device according to example embodiments may be implemented with any volatile memory device, e.g., a static random access memory (SRAM) device, etc., or any nonvolatile memory device, e.g., a flash memory device, a magnetic random access memory (MRAM) device, a resistive random access memory (RRAM) device, a phase change random access memory (PRAM) device and a ferroelectric random access memory (FRAM) device, etc.

Figure 3:
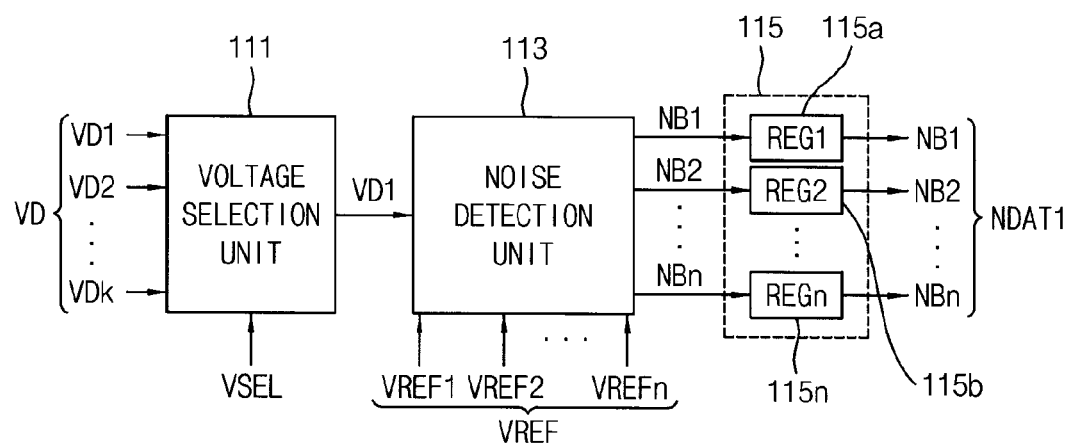
FIG. 3 is a block diagram illustrating an example of a digital noise measurement circuit included in the semiconductor memory device of FIG. 1.

FIG. 3 is a block diagram illustrating an example of a digital noise measurement circuit included in the semiconductor memory device of FIG. 1. Referring to FIG. 3, a digital noise measurement circuit 110a may include a voltage selection unit 111, a noise detection unit 113. The digital noise measurement circuit 110a may further include a noise storage unit 115.

The voltage selection unit 111 may select the first operation voltage VD1, which is desired to detect noise, among the plurality of operation voltages VD1 based on the voltage selection signal VSEL. For example, the plurality of operation voltages VD may include first through k-th operation voltages VD1, VD2, . . . , VDk, where k is a natural number equal to or greater than two. Although not illustrated in FIG. 3, the voltage selection unit 111 may select one of the second through k-th operation voltages VD2, . . . , VDk.

The noise detection unit 113 may generate portions or bits NB1, NB2, . . . , NBn of the first noise data NDAT1 by comparing a voltage selected by the voltage selection unit 111 (e.g., the first operation voltage VD1) with the plurality of reference voltages VREF. For example, the plurality of reference voltages VREF may include first through n-th reference voltages VREF1, VREF2, . . . , VREFn.

In some example embodiments, the noise detection unit 113 may generate the first bit NB1 among the bits of the first noise data NDAT1 by comparing the first operation voltage VD1 with the first reference voltage VREF1 among the plurality of reference voltages VREF. The noise detection unit 113 may generate the second bit NB2 among the bits of the first noise data NDAT1 by comparing the first operation voltage VD1 with the second reference voltage VREF2 among the plurality of reference voltages VREF. The noise detection unit 113 may generate the n-th bit NBn among the bits of the first noise data NDAT1 by comparing the first operation voltage VD1 with the n-th reference voltage VREFn among the plurality of reference voltages VREF. For example, the first bit NB1 may correspond to a least significant bit (LSB) of the first noise data NDAT1, and the n-th bit NBn may correspond to a most significant bit (MSB) of the first noise data NDAT1. The noise detection unit 113 may sequentially generate the first through n-th bits NB1, . . . , NBn bit by bit to generate the first noise data NDAT1.

In some example embodiments, as illustrated in FIG. 3, the number of the plurality of reference voltages VREF may be substantially the same as the number of the bits of the first noise data NDAT1. In other example embodiments, the number of the plurality of reference voltages VREF may be different from the number of the bits of the first noise data NDAT1.

The noise storage unit 115 may store and may output the bits NB1, . . . , NBn of the first noise data NDAT1. The noise storage unit 115 may include a plurality of registers 115a, 115b, . . . , 115n. Each of the plurality of registers 115a, . . . , 115n may store a respective one of the bits NB1, . . . , NBn of the first noise data NDAT1. For example, the first register 115a may store the first bit NB1 of the first noise data NDAT1. The second register 115b may store the second bit NB2 of the first noise data NDAT1. The n-th register 115n may store the n-th bit NBn of the first noise data NDAT1.

In some example embodiments, the plurality of registers 115a, . . . , 115n may be MPRs that are included in a DDR4 SDRAM. In this case, the first noise data NDAT1 may be stored into the plurality of registers 115a, . . . , 115n during a MPR setting operation, and the first noise data NDAT1 may be output from the plurality of registers 115a, . . . , 115n during a MPR read operation.

The first noise, which corresponds to the first noise data NDAT1 that is detected by the noise detection unit 113 and is stored in the noise storage unit 115, may be peak noise among noises in the first operation voltage VD1. For example, the first noise may include at least one of positive peak noise and negative peak noise. In some example embodiments, the first noise may include the positive peak noise. In other example embodiments, the first noise may include the negative peak noise. In still example embodiments, the first noise may include both the positive peak noise and the negative peak noise. The positive peak noise may correspond to a positive peak level of the first operation voltage VD1, and the negative peak noise may correspond to a negative peak level of the first operation voltage VD1.

Figure 4:
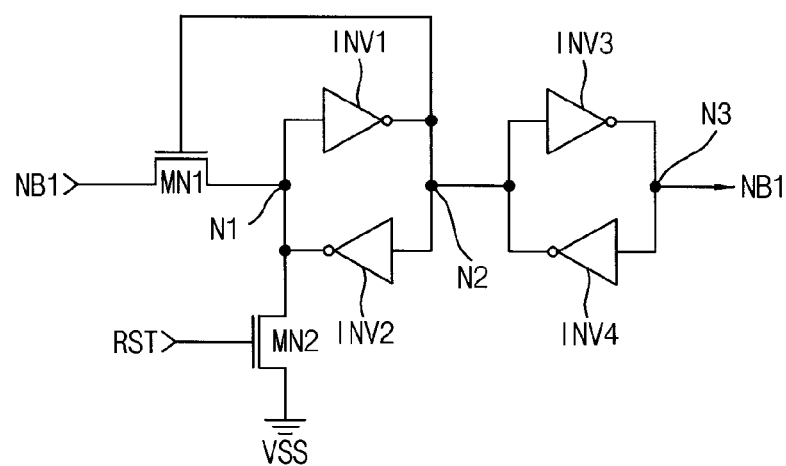
FIGS. 4 and 5 are circuit diagrams illustrating examples of a first register included in the digital noise measurement circuit of FIG. 3.
Figure 5:
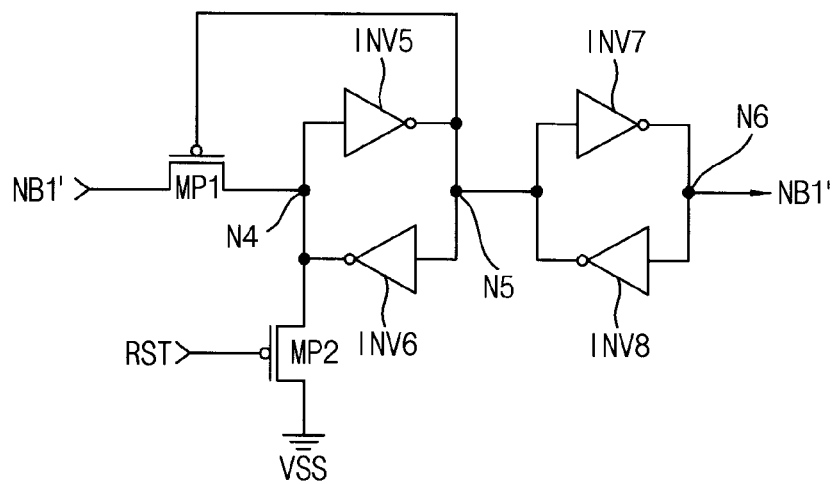

FIGS. 4 and 5 are circuit diagrams illustrating examples of a first register included in the digital noise measurement circuit of FIG. 3. Referring to FIG. 4, a first register 116 may include a first n-type metal oxide semiconductor (NMOS) transistor MN1, a second NMOS transistor MN2, a first inverter INV1, a second inverter INV2, a third inverter INV3 and a fourth inverter INV4.

The first NMOS transistor MN1 may be connected between a first node N1 and the first bit NB1 among the bits of the first noise data NDAT1. The first NMOS transistor MN1 may have a gate electrode connected to a second node N2. The second NMOS transistor MN2 may be connected between the first node N1 and a ground voltage VSS. The second NMOS transistor MN2 may have a gate electrode receiving a reset signal RST.

The first inverter INV1 may have an input terminal connected to the first node N1 and an output terminal connected to the second node N2. The second inverter INV2 may have an input terminal connected to the second node N2 and an output terminal connected to the first node N1. The third inverter INV3 may have an input terminal connected to the second node N2 and an output terminal connected to a third node N3. The fourth inverter INV4 may have an input terminal connected to the third node N3 and an output terminal connected to the second node N2. The first bit NB1 among the bits of the first noise data NDAT1 may be output from the third node N3.

In the example of the first register 116 of FIG. 4 including the NMOS transistors MN1 and MN2, the first node N1 may be reset to a first logic level (e.g., a logic high level) when the reset signal is activated. Thus, the first register 116 may operate in response to the first noise including the positive peak noise. In other words, the first register 116 may store the positive peak noise.

Referring to FIG. 5, a first register 117 may include a first p-type metal oxide semiconductor (PMOS) transistor MP1, a second PMOS transistor MP2, a first inverter INV5, a second inverter INV6, a third inverter INV7 and a fourth inverter INV8.

The first PMOS transistor MP1 may be connected between a first node N4 and the first bit NB1' among the bits of the first noise data NDAT1. The first PMOS transistor MP1 may have a gate electrode connected to a second node N5. The second PMOS transistor MP2 may be connected between the first node N4 and the ground voltage VSS. The second PMOS transistor MP2 may have a gate electrode receiving the reset signal RST.

The first inverter INV5 may have an input terminal connected to the first node N4 and an output terminal connected to the second node N5. The second inverter INV6 may have an input terminal connected to the second node N5 and an output terminal connected to the first node N4. The third inverter INV7 may have an input terminal connected to the second node N5 and an output terminal connected to a third node N6. The fourth inverter INV8 may have an input terminal connected to the third node N6 and an output terminal connected to the second node N5. The first bit NB1' among the bits of the first noise data NDAT1 may be output from the third node N6.

In the example of the first register 117 of FIG. 5 including the PMOS transistors MP1 and MP2, the first node N4 may be reset to a second logic level (e.g., a logic low level) when the reset signal is activated. Thus, the first register 117 may operate in response to the first noise including the negative peak noise. In other words, the first register 117 may store the negative peak noise.

In some example embodiments, the first register 115a included in the digital noise measurement circuit 110a of FIG. 3 may include both the circuit of FIG. 4 and the circuit of FIG. 5. For example, when the first noise includes both the positive peak noise and the negative peak noise, the first register 115a may be implemented to store both the positive peak noise and the negative peak noise.

Although not illustrated in FIGS. 4 and 5, each of the second through n-th registers 115b, . . . , 115n in FIG. 3 may have a configuration that is substantially the same as the configuration of the first register 115a.

FIGS. 6A, 6B, 7A and 7B are timing diagrams for describing operations of the semiconductor memory device of FIG. 1.

Figure 6A:
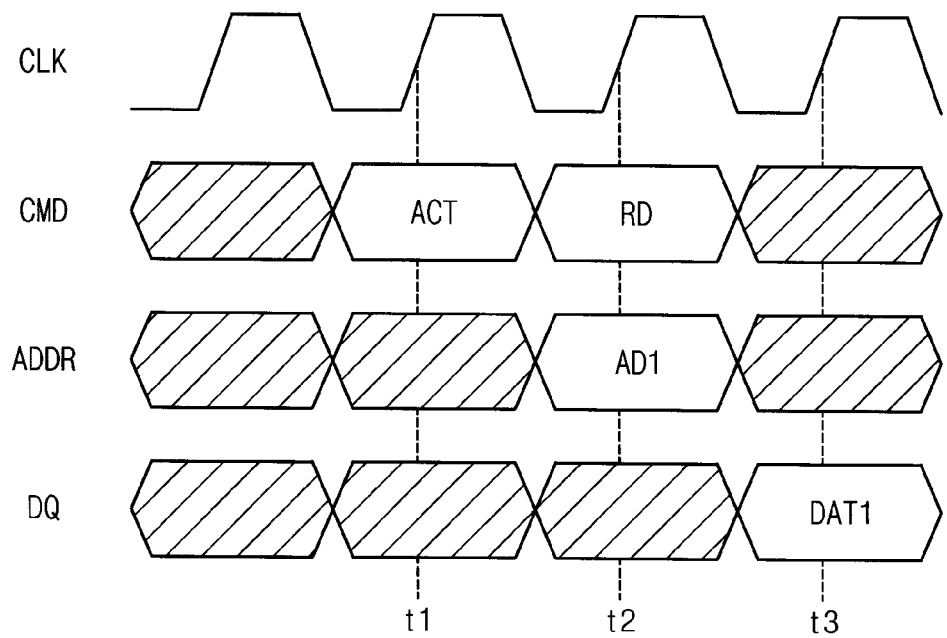
FIGS. 6A, 6B, 7A and 7B are timing diagrams for describing operations of the semiconductor memory device of FIG. 1.
Figure 6B:
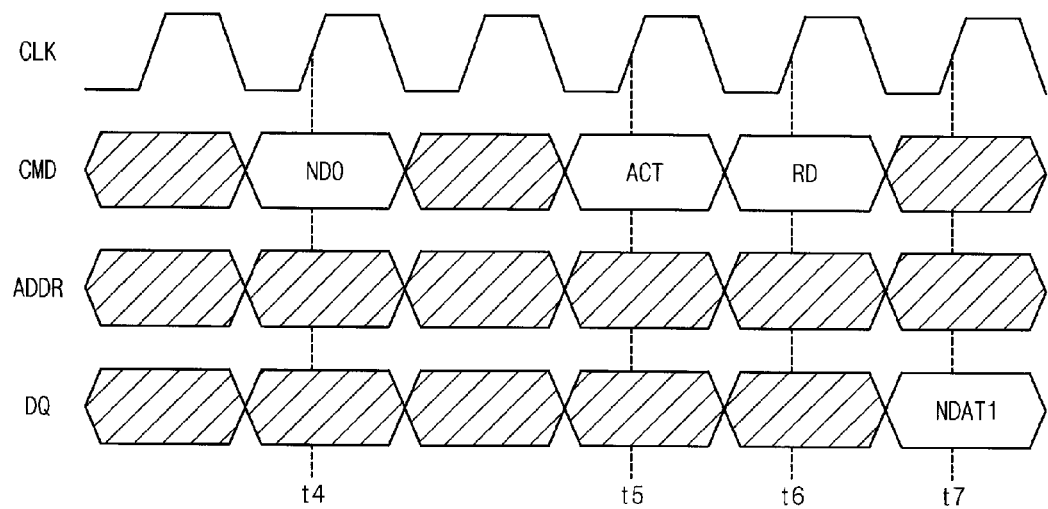
Figure 7A:
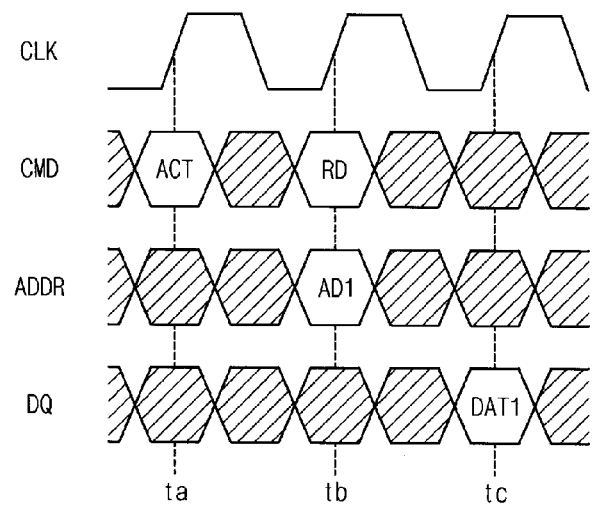
Figure 7B:
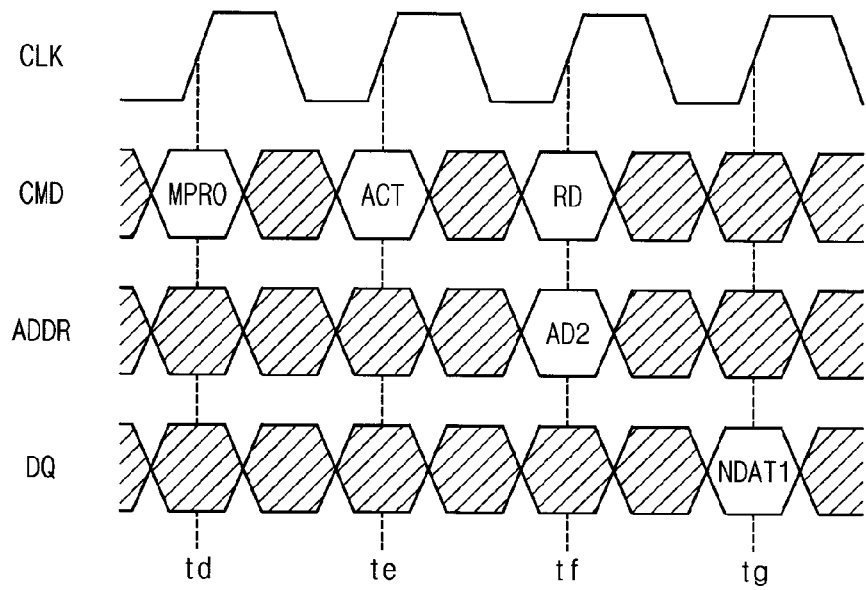

FIGS. 6A and 6B illustrate operations of the output selection circuit 130 in FIG. 1 that outputs the first data DAT1 and the first noise data NDAT1 when the semiconductor memory device of FIG. 1 is implemented with a SDRAM. FIGS. 7A and 7B illustrate operations of the output selection circuit 130 in FIG. 1 that outputs the first data DAT1 and the first noise data NDAT1 when the semiconductor memory device of FIG. 1 is implemented with a DDR SDRAM (particularly a DDR4 SDRAM). In FIGS. 6A, 6B, 7A and 7B, "CLK", "CMD", "ADDR" and "DQ" represent a clock signal, a command, an address and data, respectively.

Referring to FIGS. 1 and 6A, at time t1, an active command ACT is generated. At time t2, a read command RD and a first address AD1 corresponding to data to be read are generated. Since an additional command for outputting noise data is not generated, the output selection signal OSEL is deactivated. The first operation mode (e.g., the normal output mode) and the normal output path are enabled based on the deactivated output selection signal OSEL. At time t3, the first data DAT1 corresponding to the first address AD1 is output.

Referring to FIGS. 1 and 6B, at time t4, a noise output command NDO is generated. The output selection signal OSEL is activated based on the noise output command NDO. The second operation mode (e.g., the noise output mode) and the noise output path are enabled based on the activated output selection signal OSEL. At time t5, the active command ACT is generated. At time t6, the read command RD is generated. At time t7, the first noise data NDAT1 is output from the digital noise measurement circuit 110. An address for outputting the first noise data NDAT1 is not required.

Although FIGS. 6A and 6B illustrate the example where commands, addresses and/or data are transmitted in response to rising edges of the clock signal CLK, the commands, the addresses and/or the data may be transmitted in response to falling edges of the clock signal CLK.

Referring to FIGS. 1 and 7A, at time ta, the active command ACT is generated. At time tb, the read command RD and the first address AD1 corresponding to the data to be read are generated. Since an additional command for outputting noise data is not generated, the output selection signal OSEL (e.g., the MPR enable signal) is deactivated. The first operation mode (e.g., the normal output mode) and the normal output path are enabled based on the deactivated output selection signal OSEL. At time tc, the first data DAT1 corresponding to the first address AD1 is output.

Referring to FIGS. 1 and 7B, at time td, an MPR output command MPRO is generated. The output selection signal OSEL (e.g., the MPR enable signal) is activated based on the MPR output command MPRO. The second operation mode (e.g., the MPR output mode) and the noise output path are enabled based on the activated output selection signal OSEL. At time te, the active command ACT is generated. At time tf, the read command RD and a second address AD2 are generated. At time tg, the first noise data NDAT1 is output from the digital noise measurement circuit 110 (e.g. the MPRs) corresponding to the second address AD2.

Although not illustrated in FIGS. 6A, 6B, 7A and 7B, each of the first data DAT1 and the first noise data NDAT1 may be sequentially output bit by bit.

Figure 8:
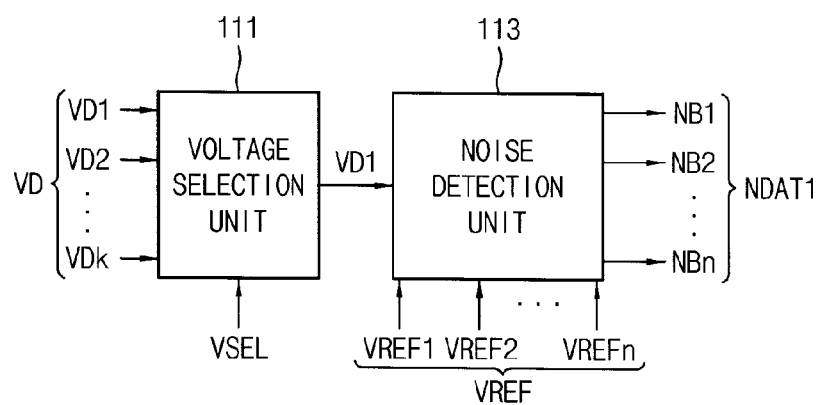
FIGS. 8 and 9 are block diagrams illustrating other examples of a digital noise measurement circuit included in the semiconductor memory device of FIG. 1.
Figure 9:
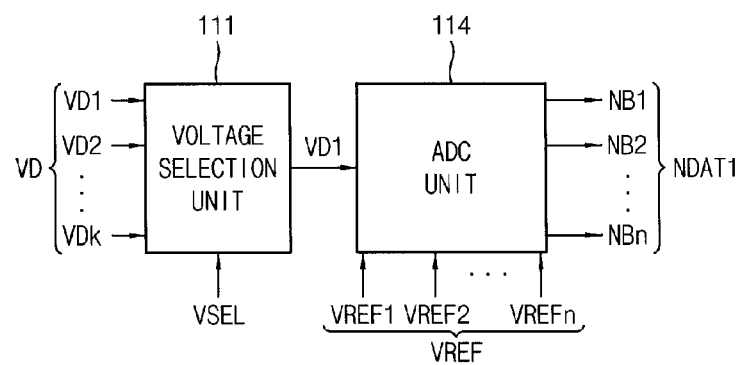

FIGS. 8 and 9 are block diagrams illustrating other examples of a digital noise measurement circuit included in the semiconductor memory device of FIG. 1.

Referring to FIG. 8, a digital noise measurement circuit 110b may include a voltage selection unit 111 and a noise detection unit 113. The digital noise measurement circuit 110b of FIG. 8 may be substantially the same as the digital noise measurement circuit 110a of FIG. 3, except that the noise storage unit 115 in FIG. 3 is omitted. The voltage selection unit 111 may select the first operation voltage VD1 among the plurality of operation voltages VD1 based on the voltage selection signal VSEL. The noise detection unit 113 may generate the bits NB1, NB2, . . . , NBn of the first noise data NDAT1 by comparing the voltage selected by the voltage selection unit 111 (e.g., the first operation voltage VD1) with the plurality of reference voltages VREF. The noise detection unit 113 may sequentially generate the first through n-th bits NB1, . . . , NBn bit by bit to generate the first noise data NDAT1.

Referring to FIG. 9, a digital noise measurement circuit 110c may include a voltage selection unit 111 and an analog-to-digital conversion (ADC) unit 114. The voltage selection unit 111 may select the first operation voltage VD1 among the plurality of operation voltages VD1 based on the voltage selection signal VSEL. The ADC unit 114 may generate the bits NB1, NB2, . . . , NBn of the first noise data NDAT1 by comparing the voltage selected by the voltage selection unit 111 (e.g., the first operation voltage VD1) with the plurality of reference voltages VREF. The ADC unit 114 may substantially simultaneously generate the first through n-th bits NB1, . . . , NBn to generate the first noise data NDAT1.

Figure 10:
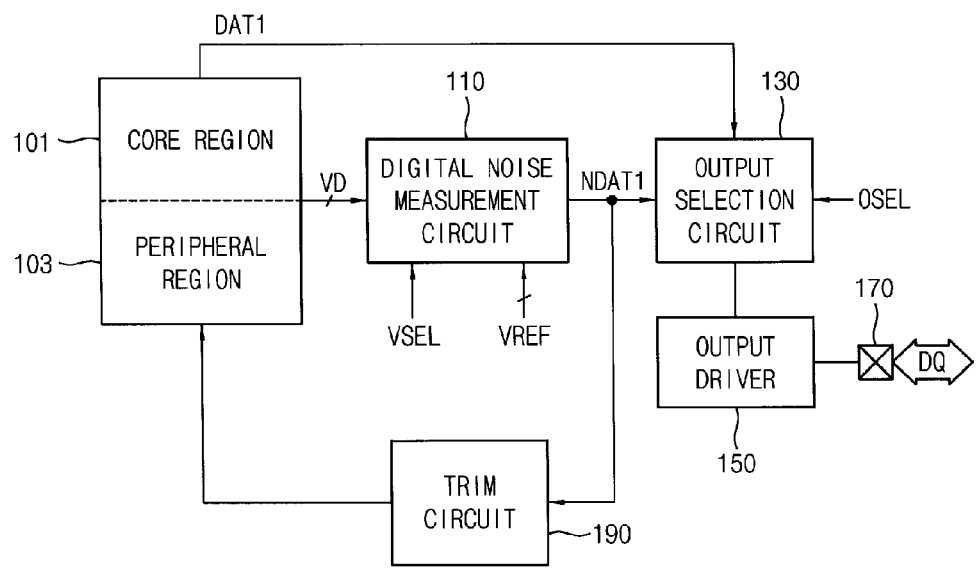
FIGS. 10 and 11 are block diagrams illustrating a semiconductor memory device according to example embodiments.
Figure 11:
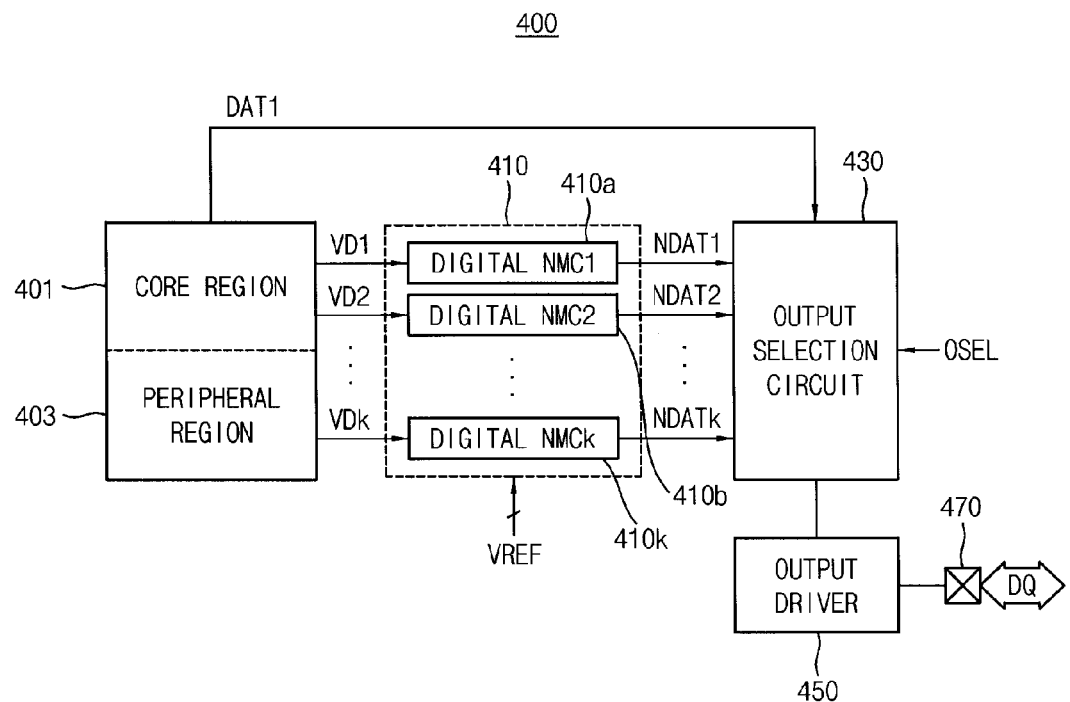

FIGS. 10 and 11 are block diagrams illustrating a semiconductor memory device according to example embodiments. Referring to FIG. 10, a semiconductor memory device 100a includes a core region 101 for storing data and a peripheral region 103 for controlling the core region 101. The semiconductor memory device 100a includes a digital noise measurement circuit 110 and an output selection circuit 130. The semiconductor memory device 100a may further include an output driver 150, a data I/O pad 170 and a trim circuit 190.

The core region 101, the peripheral region 103, the digital noise measurement circuit 110, the output selection circuit 130, the output driver 150 and the data I/O pad 170 in FIG. 10 may be substantially the same as the core region 101, the peripheral region 103, the digital noise measurement circuit 110, the output selection circuit 130, the output driver 150 and the data I/O pad 170 in FIG. 1, respectively. The digital noise measurement circuit 110 selects a first operation voltage (e.g., VD1 in FIG. 3), which is desired to detect noise, among a plurality of operation voltages VD based on a voltage selection signal VSEL. The digital noise measurement circuit 110 generates first noise data NDAT1 by digitizing first noise in the first operation voltage VD1 based on a plurality of reference voltages VREF and outputs the first noise data NDAT1. The output selection circuit 130 outputs one of first data DAT1 and the first noise data NDAT1 based on an output selection signal OSEL. The output driver 150 may be connected to the output selection circuit 130. The data I/O pad 170 may be connected to the output driver 150.

The trim circuit 190 may adjust the first operation voltage VD1 based on the first noise data NDAT1 to enhance an operation of the semiconductor memory device 100a. For example, the first operation voltage VD1 may be one of the plate voltage VP and the bitline precharge voltage VBL. When the first noise data NDAT1 is smaller than reference noise data, the trim circuit 190 may increase a deadzone associated with the first operation voltage VD1 (e.g., the plate voltage VP or the bitline precharge voltage VBL). When the deadzone associated with the first operation voltage VD1 increases, a leakage current from the semiconductor memory device 100a may decrease. The deadzone may represent an area or a region that does not operate based on the first operation voltage VD1. When the first noise data NDAT1 is equal to or greater than the reference noise data, the trim circuit 190 may decrease the deadzone associated with the first operation voltage VD1 (e.g., the plate voltage VP or the bitline precharge voltage VBL). When the deadzone associated with the first operation voltage VD1 decreases, the leakage current from the semiconductor memory device 100a may increase, however, the noise in the first operation voltage VD1 may decrease.

Referring to FIG. 11, a semiconductor memory device 400 includes a core region 401 for storing data and a peripheral region 403 for controlling the core region 401. The semiconductor memory device 400 includes a noise measurement circuit 410 and an output selection circuit 430. The semiconductor memory device 400 may further include an output driver 450 and a data I/O pad 470.

The core region 401, the peripheral region 403, the output driver 450 and the data I/O pad 470 in FIG. 11 may be substantially the same as the core region 101, the peripheral region 103, the output driver 150 and the data I/O pad 170 in FIG. 1, respectively. The output driver 450 may be connected to the output selection circuit 430. The data I/O pad 470 may be connected to the output driver 450.

The noise measurement circuit 410 may include a plurality of digital noise measurement circuits 410a, 410b, . . . , 410k. Each of the plurality of digital noise measurement circuits 410a, . . . , 410k generates a respective one of a plurality of noise data NDAT1, NDAT2, . . . , NDATk by digitizing noise in a respective one of a plurality of operation voltages VD1, VD2, . . . , VDk based on a plurality of reference voltages VREF and outputs the respective one of the plurality of noise data NDAT1, . . . , NDATk. The plurality of operation voltages VD1, . . . , VDk are supplied to the core region 401 and the peripheral region 403.

For example, the first digital noise measurement circuit 410a may generate the first noise data NDAT1 by digitizing noise in the first operation voltage VD1 and may output the first noise data NDAT1. The second digital noise measurement circuit 410b may generate the second noise data NDAT2 by digitizing noise in the second operation voltage VD2 and may output the second noise data NDAT2. The k-th digital noise measurement circuit 410k may generate the k-th noise data NDATk by digitizing noise in the k-th operation voltage VDk and may output the k-th noise data NDATk, where k is a natural number equal to or greater than two.

In some example embodiments, each of the plurality of digital noise measurement circuits 410a, . . . , 410k may only include the noise detection unit 113 in FIG. 3 and the noise storage unit 115 in FIG. 3. In other example embodiments, each of the plurality of digital noise measurement circuits 410a, . . . , 410k may only include the noise detection unit 113 in FIG. 8. In still other example embodiments, each of the plurality of digital noise measurement circuits 410a, . . . , 410k may only include the ADC unit 114 in FIG. 9. In other words, differently from the digital noise measurement circuit 110a of FIG. 3, the digital noise measurement circuit 110b of FIG. 8 and the digital noise measurement circuit 110c of FIG. 9, a voltage selection unit (e.g., the element 111 in FIGS. 3, 8 and 9) may be omitted in each of the plurality of digital noise measurement circuits 410a, . . . , 410k in FIG. 11.

The output selection circuit 430 outputs one of first data DAT1 and the plurality of noise data NDAT1, . . . , NDATk based on an output selection signal OSEL. The first data DAT1 is provided from the core region 401. For example, the output selection circuit 430 may output the first data DAT1 based on a read command when a first operation mode (e.g., a normal output mode) is enabled based on the output selection signal OSEL and may output one of the plurality of noise data NDAT1, . . . , NDATk based on the read command when a second operation mode (e.g., a noise output mode or an MPR output mode) is enabled based on the output selection signal OSEL.

Although FIG. 11 illustrates the example where the semiconductor memory device 400 includes a single output selection circuit 430, a single output driver 450, a single data I/O pad 470, the semiconductor memory device according to example embodiments may include a plurality of output selection circuits, a plurality of output drivers and a plurality of data I/O pads.

Figure 12:
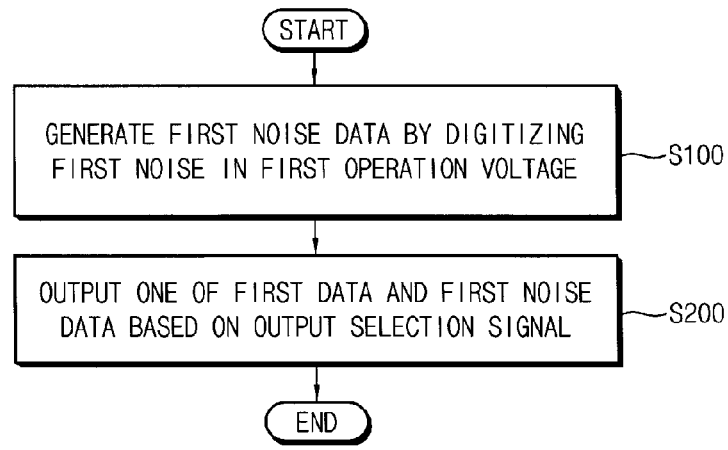
FIG. 12 is a flow chart illustrating a method of measuring noise in a semiconductor memory device according to example embodiments.

FIG. 12 is a flow chart illustrating a method of measuring noise in a semiconductor memory device according to example embodiments. Referring to FIGS. 1, 3 and 12, in the method of measuring noise in the semiconductor memory device according to example embodiments, the first noise data NDAT1 is generated by digitizing the first noise in the first operation voltage VD1 among the plurality of operation voltages VD (step S100). For example, the digital noise measurement circuit 110 may select the first operation voltage VD1, which is desired to detect noise, among the plurality of operation voltages VD based on the voltage selection signal VSEL. The digital noise measurement circuit 110 may generate the first noise data NDAT1 by digitizing the first noise based on the plurality of reference voltages VREF and outputs the first noise data NDAT1. The first noise may be peak noise among noises in the first operation voltage VD1 and may include at least one of the positive peak noise and the negative peak noise.

One of the first data DAT1 and the first noise data NDAT1 is output based on the output selection signal OSEL (step S200). The first data DAT1 is provided from the core region 101. For example, the first data DAT1 may be normal data stored in the core region 101 (e.g., in the plurality of memory cells). The first noise data NDAT1 may correspond to the first noise in the first operation voltage VD1.

Figure 13:
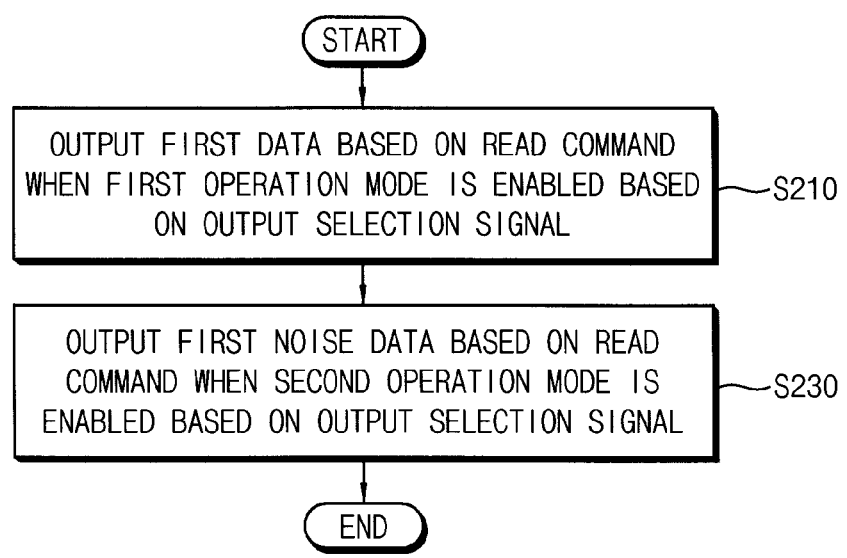
FIG. 13 is a flow chart illustrating an example of outputting one of first data and first noise data in FIG. 12.

FIG. 13 is a flow chart illustrating an example of outputting one of first data and first noise data in FIG. 12. Referring to FIGS. 1, 12 and 13, in step S200, the first data DAT1 may be output based on the read command when the first operation mode is enabled based on the output selection signal OSEL (step S210). For example, the output selection circuit 130 may enable the normal output path connected to the core region 101 in the first operation mode. The first data DAT1 provided from the core region 101 may be output from the semiconductor memory device 100 via the output driver 150 and the data I/O pad 170.

The first noise data NDAT1 may be output based on the read command when the second operation mode is enabled based on the output selection signal OSEL (step S230). For example, the output selection circuit 130 may enable the noise output path connected to the digital noise measurement circuit 110 in the second operation mode. The first noise data NDAT1 provided from the digital noise measurement circuit 110 may be output from the semiconductor memory device 100 via the output driver 150 and the data I/O pad 170.

In some example embodiments, the first operation mode may be the normal output mode. The second operation mode may be the noise output mode or the MPR output mode. When the second operation mode is the MPR output mode, the output selection signal OSEL may be the MPR enable signal.

In the method of measuring noise in the semiconductor memory device 100 according to example embodiments, the noise data NDAT1 may be generated, in the semiconductor memory device 100, by digitizing the noise in the operation voltages VD, and thus the noise in the operation voltages VD may be efficiently detected without loss and/or attenuation. In addition, the semiconductor memory device 100 may selectively enable the noise output path based on the output selection signal OSEL and may selectively output the noise data NDAT1 via the noise output path and the data I/O pad 170, and thus the digital noise data NDAT1 may be efficiently output.

Figure 14:
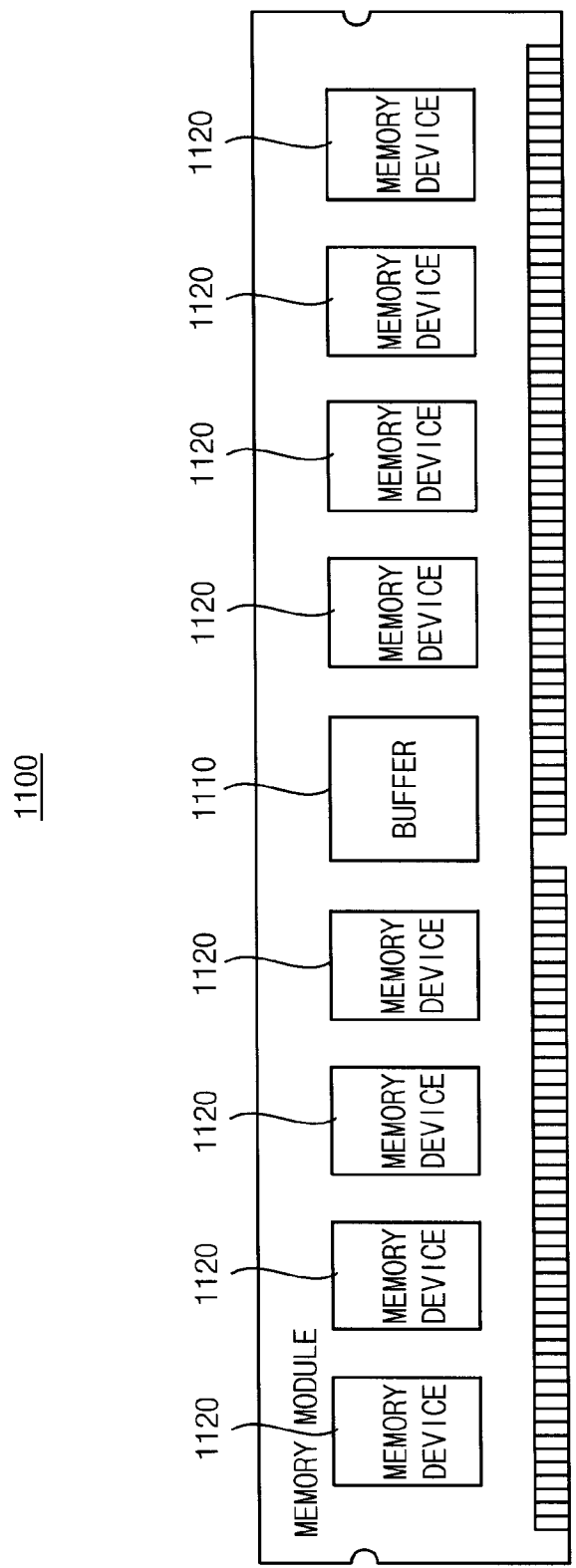
FIG. 14 is a block diagram illustrating a memory module according to example embodiments.

FIG. 14 is a block diagram illustrating a memory module according to example embodiments. Referring to FIG. 14, a memory module 1100 may include a plurality of semiconductor memory devices 1120. According to example embodiments, the memory module 1100 may be an unbuffered dual in-line memory module (UDIMM), a registered dual in-line memory module (RDIMM), a fully buffered dual in-line memory module (FBDIMM), a load reduced dual in-line memory module (LRDIMM), etc.

The memory module 1100 may further include a buffer 1110. The buffer 1110 may receive a command, an address and/or data from a memory controller (not illustrated) via a plurality of transmission lines, and may provide the command, the address and/or the data to the plurality of semiconductor memory devices 1120 by buffering the command, the address and/or the data.

In some example embodiments, data transmission lines between the buffer 1110 and the semiconductor memory devices 1120 may be connected in a point-to-point topology. In some example embodiments, command/address transmission lines between the buffer 1110 and the semiconductor memory devices 1120 may be connected in a multi-drop topology, a daisy-chain topology, a fly-by daisy-chain topology, or the like. Since the buffer 1110 buffers all of the command signal, the address signal and the data, the memory controller may interface with the memory module 1100 by driving only a load of the buffer 1110. Accordingly, the memory module 1100 may include more semiconductor memory devices 1120 and/or more memory ranks, and a memory system may include more memory modules.

Each of the semiconductor memory devices 1120 may be one of the semiconductor memory device 100 of FIG. 1, the semiconductor memory device 100a of FIG. 10 and the semiconductor memory device 400 of FIG. 11. Each of the semiconductor memory devices 1120 may generate, in the semiconductor memory devices 1120, the noise data by digitizing the noise in the operation voltages, and thus the noise in the operation voltages may be efficiently detected without loss and/or attenuation. In addition, each of the semiconductor memory devices 1120 may selectively output the noise data via the data I/O pad and the noise output path that is selectively enabled based on the output selection signal, and thus the digital noise data may be efficiently output.

Figure 15:
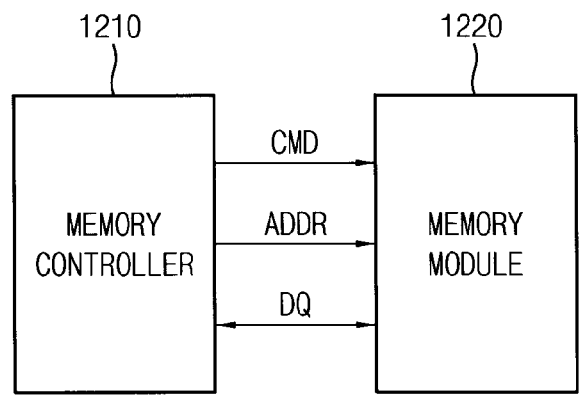
FIG. 15 is a block diagram illustrating a memory system according to example embodiments.

FIG. 15 is a block diagram illustrating a memory system according to example embodiments. Referring to FIG. 15, a memory system 1200 may include a memory controller 1210 and a memory module 1220.

The memory controller 1210 may transmit a command CMD to the memory module 1220 via a command transmission line, may transmit an address ADDR to the memory module 1220 via an address transmission line, and may exchange data DQ with the memory module 1220 via a data transmission line. The memory controller 1210 may input data to the memory module 1220 or may receive data output from the memory module 1220 based on a request from a host (not illustrated).

The memory module 1220 may be the memory module 1100 of FIG. 14 and may include a plurality of semiconductor memory devices. Each semiconductor memory device may generate, in the semiconductor memory device, the noise data by digitizing the noise in the operation voltages, and thus the noise in the operation voltages may be efficiently detected without loss and/or attenuation. In addition, each semiconductor memory device may selectively output the noise data via the data I/O pad and the noise output path that is selectively enabled based on the output selection signal, and thus the digital noise data may be efficiently output.

Figure 16:
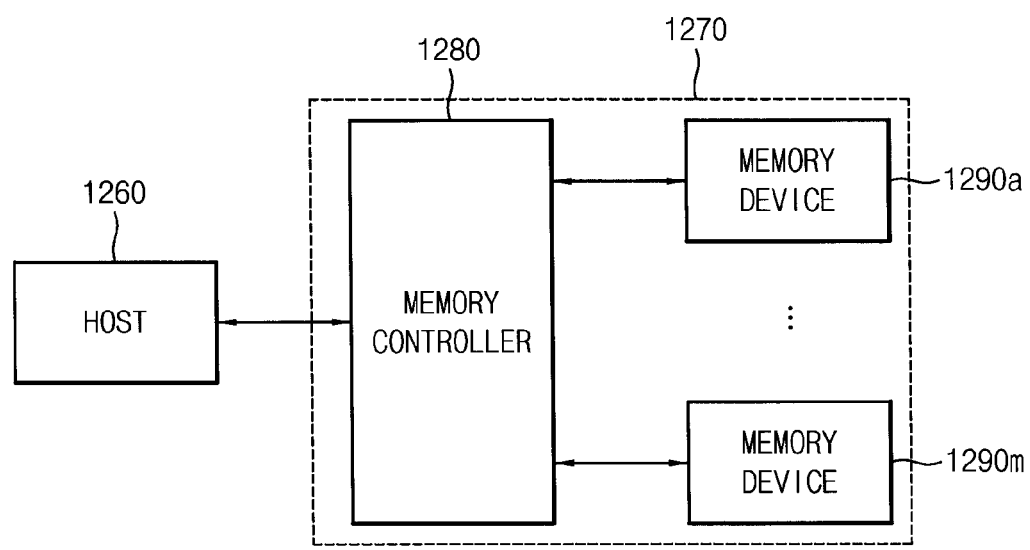
FIG. 16 is a block diagram illustrating an electronic system according to example embodiments.

FIG. 16 is a block diagram illustrating an electronic system according to example embodiments. Referring to FIG. 16, an electronic system 1250 may include a host 1260 and a memory system 1270. The memory system 1270 may include a memory controller 1280 and a plurality of semiconductor memory devices 1290a, . . . , 1290m.

The host 1260 may communicate with the memory system 1270 through various interface protocols such as Peripheral Component Interconnect-Express (PCI-E), Advanced Technology Attachment (ATA), Serial ATA (SATA), Parallel ATA (PATA), serial attached SCSI (SAS), etc. In addition, the host 1260 may also communicate with the memory system 1270 through interface protocols such as Universal Serial Bus (USB), Multi-Media Card (MMC), Enhanced Small Disk Interface (ESDI), or Integrated Drive Electronics (IDE).

The memory controller 1280 may control an overall operation of the memory system 1270. The memory controller 1280 may control an overall data exchange between the host 1260 and the plurality of semiconductor memory devices 1290a, . . . , 1290m. For example, the memory controller 1280 may write data in the plurality of semiconductor memory devices 1290a, . . . , 1290m or may read data from the plurality of semiconductor memory devices 1290a, . . . , 1290m in response to requests from the host 1260.

In addition, the memory controller 1280 may issue operation commands to the plurality of semiconductor memory devices 1290a, . . . , 1290m for controlling the plurality of semiconductor memory devices 1290a, . . . , 1290m.

Each of the semiconductor memory devices 1290a, . . . , 1290m may generate, in the semiconductor memory devices 1290a, . . . , 1290m, the noise data by digitizing the noise in the operation voltages, and thus the noise in the operation voltages may be efficiently detected without loss and/or attenuation. In addition, each of the semiconductor memory devices 1290a, . . . , 1290m may selectively output the noise data via the data I/O pad and the noise output path that is selectively enabled based on the output selection signal, and thus the digital noise data may be efficiently output.

In some example embodiments, each of the semiconductor memory devices 1290a, ..., 1290m may be a DRAM, such as a DDR SDRAM, a low power DDR (LPDDR) SDRAM, a graphics DDR (GDDR) SDRAM, a Rambus DRAM (RDRAM), etc., or may be other types (e.g., volatile or nonvolatile) of semiconductor memory devices.

Figure 17:
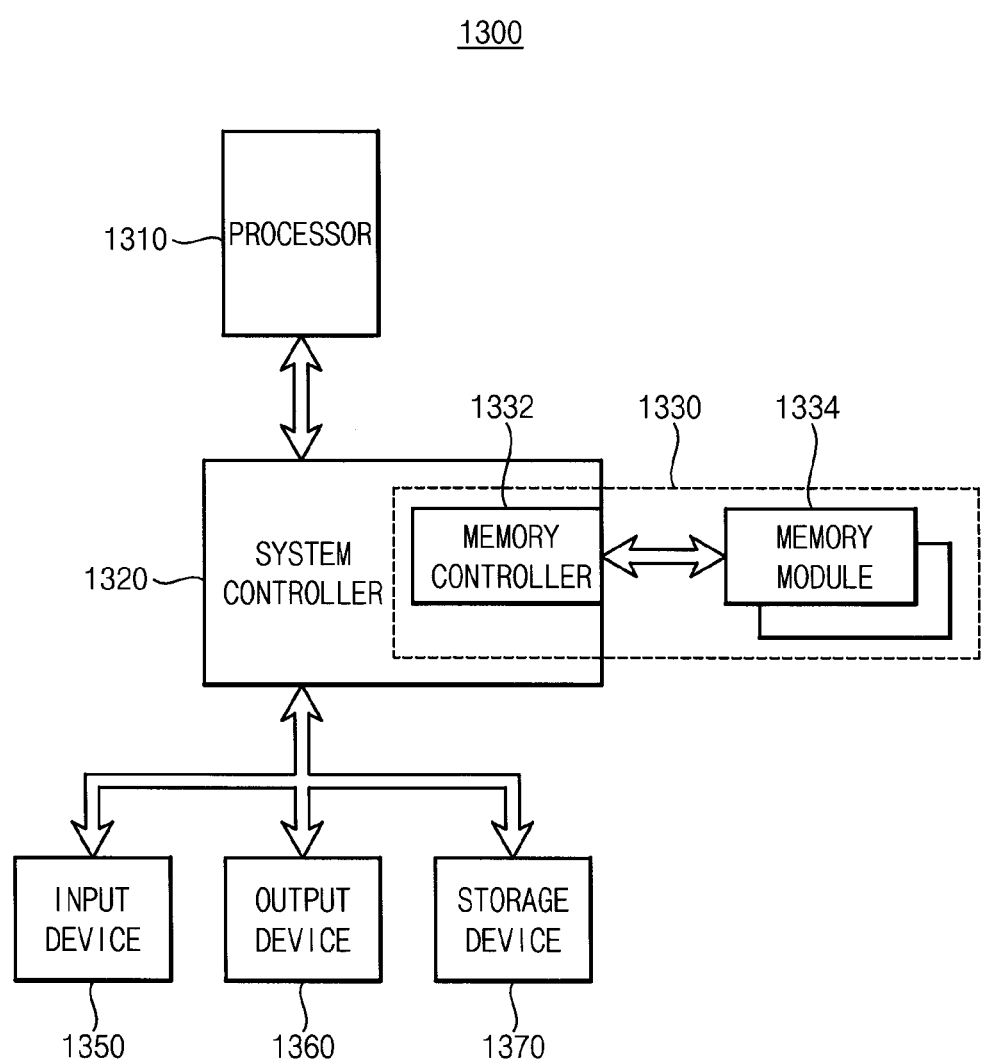
FIG. 17 is a block diagram illustrating a computing system according to example embodiments.

FIG. 17 is a block diagram illustrating a computing system according to example embodiments. Referring to FIG. 17, a computing system 1300 may include a processor 1310, a system controller 1320 and a memory system 1330. The computing system 1300 may further include an input device 1350, an output device 1360 and a storage device 1370.

The memory system 1330 may include a plurality of memory modules 1334 and a memory controller 1332 for controlling the memory modules 1334. The memory modules 1334 may include a plurality of semiconductor memory devices. The memory controller 1332 may be included in the system controller 1320. Each of the memory modules 1334 may be the memory module 1100 of FIG. 14 and may include a plurality of semiconductor memory devices. Each semiconductor memory device may generate, in the semiconductor memory device, the noise data by digitizing the noise in the operation voltages, and thus the noise in the operation voltages may be efficiently detected without loss and/or attenuation. In addition, each semiconductor memory device may selectively output the noise data via the data I/O pad and the noise output path that is selectively enabled based on the output selection signal, and thus the digital noise data may be efficiently output.

The processor 1310 may perform various computing functions, such as executing specific software for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

In an embodiment of the present inventive concept, a three-dimensional (3D) memory array may be provided in at least one of the semiconductor memory device 100 of FIG. 1, the semiconductor memory device of FIG. 2, the semiconductor memory device 100a of FIG. 10, the semiconductor memory device 400 of FIG. 11, the semiconductor memory devices 1120 in FIG. 14, the memory module 1220 in FIG. 15, the semiconductor memory devices 1290a, ..., 1290m in FIG. 16 and the memory modules 1334 in FIG. 17. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The present disclosure may be used in a semiconductor memory device or system including the semiconductor memory device, such as a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device including a core region configured to store data and a peripheral region configured to control the core region, the semiconductor memory device comprising:
   a digital noise measurement circuit configured to select a first operation voltage among a plurality of operation voltages based on a voltage selection signal, configured to generate first noise data by digitizing first noise in the first operation voltage based on a plurality of reference voltages, and configured to output the first noise data, wherein the plurality of operation voltages are supplied to the core region and the peripheral region; and
   an output selection circuit configured to output one of first data and the first noise data based on an output selection signal, the first data being provided from the core region.

2. The semiconductor memory device of claim 1, wherein the output selection circuit is configured to output the first data based on a read command when a first operation mode is enabled based on the output selection signal; and wherein the output selection circuit is configured to output the first noise data based on the read command when a second operation mode is enabled based on the output selection signal.

3. The semiconductor memory device of claim 2, wherein the first operation mode is a regular output mode, the second operation mode is a multi-purpose register (MPR) output mode, and the output selection signal is an MPR enable signal.

4. The semiconductor memory device of claim 1, wherein the digital noise measurement circuit includes:
   a voltage selection unit configured to select the first operation voltage among the plurality of operation voltages based on the voltage selection signal; and
   a noise detection unit configured to generate portions of the first noise data by comparing the first operation voltage with the plurality of reference voltages.

5. The semiconductor memory device of claim 4, wherein the noise detection unit is configured to generate a first bit among the portions of the first noise data by comparing the first operation voltage with a first reference voltage among the plurality of reference voltages; and wherein the noise detection unit is configured to generate an n-th bit among the portions of the first noise data by comparing the first operation voltage with an n-th reference voltage among the plurality of reference voltages, where n is a natural number equal to or greater than two.

6. The semiconductor memory device of claim 5, wherein the first bit corresponds to a least significant bit (LSB) of the first noise data, and the n-th bit corresponds to a most significant bit (MSB) of the first noise data.

7. The semiconductor memory device of claim 4, wherein the digital noise measurement circuit further includes a noise storage unit configured to store and output the portions of the first noise data.

8. The semiconductor memory device of claim 7, wherein the noise storage unit includes a plurality of registers each configured to store a respective bit of the portions of the first noise data; and wherein a first register among the plurality of registers includes:
   a first n-type metal oxide semiconductor (NMOS) transistor connected between a first node and a first bit among the portions of the first noise data, the first NMOS transistor having a gate electrode connected to a second node;
   a second NMOS transistor connected between the first node and a ground voltage, the second NMOS transistor having a gate electrode receiving a reset signal;
   a first inverter having an input terminal connected to the first node and an output terminal connected to the second node;
   a second inverter having an input terminal connected to the second node and an output terminal connected to the first node;
   a third inverter having an input terminal connected to the second node and an output terminal connected to a third node; and
   a fourth inverter having an input terminal connected to the third node and an output terminal connected to the second node.

9. The semiconductor memory device of claim 7, wherein the noise storage unit includes a plurality of registers each configured to store a respective bit of the portions of the first noise data; wherein a first register among the plurality of registers includes:
   a first p-type metal oxide semiconductor (PMOS) transistor connected between a first node and a first bit among the portions of the first noise data, the first PMOS transistor having a gate electrode connected to a second node;
   a second PMOS transistor connected between the first node and a ground voltage, the second PMOS transistor having a gate electrode receiving a reset signal;
   a first inverter having an input terminal connected to the first node and an output terminal connected to the second node;
   a second inverter having an input terminal connected to the second node and an output terminal connected to the first node;
   a third inverter having an input terminal connected to the second node and an output terminal connected to a third node; and
   a fourth inverter having an input terminal connected to the third node and an output terminal connected to the second node.

10. The semiconductor memory device of claim 1, wherein the digital noise measurement circuit includes:
    a voltage selection unit configured to select the first operation voltage among the plurality of operation voltages based on the voltage selection signal; and
    an analog-to-digital conversion (ADC) unit configured to generate portions of the first noise data based on the first operation voltage and the plurality of reference voltages.

11. The semiconductor memory device of claim 1, further comprising a trim circuit configured to adjust the first operation voltage based on the first noise data to regulate an operation of the semiconductor memory device; wherein the trim circuit is configured to increase a deadzone associated with the first operation voltage when the first noise data is smaller than reference noise data; and wherein the trim circuit is configured to decrease the deadzone associated with the first operation voltage when the first noise data is equal to or greater than the reference noise data.

12. The semiconductor memory device of claim 1, further comprising:
    an output driver connected to the output selection circuit; and
    a data input/output (I/O) pad connected to the output driver.

13. The semiconductor memory device of claim 1, wherein the plurality of operation voltages include at least one of a plate voltage, a bitline precharge voltage, a ground voltage, a boosting voltage and a cell array operating voltage.

14. The semiconductor memory device of claim 1, wherein the first noise includes at least one of positive peak noise and negative peak noise.

15. A memory system comprising:
    a memory controller; and
    a semiconductor memory device configured to be controlled by the memory controller, the semiconductor memory device including a core region for storing data and a peripheral region for controlling the core region, and the semiconductor memory device including:
       a digital noise measurement circuit configured to select a first operation voltage among a plurality of operation voltages based on a voltage selection signal, configured to generate first noise data by digitizing first noise in the first operation voltage based on a plurality of reference voltages, and configured to output the first noise data, wherein the plurality of operation voltages are supplied to the core region and the peripheral region; and
       an output selection circuit configured to output one of first data and the first noise data based on an output selection signal, the first data being provided from the core region.

16. A method of operating a semiconductor memory device including a core region configured to store data and a peripheral region configured to control the core region, the method comprising:
    selecting a first operation voltage among a plurality of operation voltages based on a voltage selection signal, to generate first noise data by digitizing first noise in the first operation voltage based on a plurality of reference voltages, and to output the first noise data, wherein the plurality of operation voltages are supplied to the core region and the peripheral region; and
    outputting one of first data and the first noise data based on an output selection signal, the first data being provided from the core region.

17. The method of claim 16, wherein outputting comprises outputting the first data based on a read command when a first operation mode is enabled based on the output selection signal; and wherein outputting comprises outputting the first noise data based on the read command when a second operation mode is enabled based on the output selection signal.

18. The method of claim 17, wherein the first operation mode is a regular output mode, the second operation mode is a multi-purpose register (MPR) output mode, and the output selection signal is an MPR enable signal.

19. The method of claim 16, wherein portions of the first noise data are generated by comparing the first operation voltage with the plurality of reference voltages.

20. The method of claim 19, wherein a first bit, among the portions of the first noise data, is generated by comparing the first operation voltage with a first reference voltage among the plurality of reference voltages; and wherein an n-th bit, among the portions of the first noise data, is generated by comparing the first operation voltage with an n-th reference voltage among the plurality of reference voltages, where n is a natural number equal to or greater than two.

* * * * *